United States Patent
Okajo (10) Patent No.: US 7,592,569 B2
(45) Date of Patent: Sep. 22, 2009

(54) SUBSTRATE PROCESSING APPARATUS, PRESSURE CONTROL METHOD FOR SUBSTRATE PROCESSING APPARATUS AND RECORDING MEDIUM HAVING PROGRAM RECORDED THEREIN

(75) Inventor: Taketoshi Okajo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 572 days.

(21) Appl. No.: 11/254,670

(22) Filed: Oct. 21, 2005

(65) Prior Publication Data

US 2006/0086259 A1 Apr. 27, 2006

Related U.S. Application Data

(60) Provisional application No. 60/635,489, filed on Dec. 14, 2004.

(30) Foreign Application Priority Data

Oct. 21, 2004 (JP) ............................... 2004-306522

(51) Int. Cl.
 C23C 16/00 (2006.01)
 F27D 11/00 (2006.01)
(52) U.S. Cl. ..................................... 219/385; 118/725
(58) Field of Classification Search ................. 219/385, 219/386, 387, 388, 389, 390; 118/725, 724
 See application file for complete search history.

(56) References Cited

U.S. PATENT DOCUMENTS

| | | | | |
|---|---|---|---|---|
| 6,951,815 B2 * | 10/2005 | Matsuoka | .................... | 438/660 |
| 7,313,931 B2 * | 1/2008 | Matsuoka | ..................... | 65/162 |
| 2005/0279138 A1 * | 12/2005 | Matsuoka | ..................... | 65/162 |

FOREIGN PATENT DOCUMENTS

| JP | 08-134649 | 5/1996 |
|---|---|---|
| JP | 11-193464 | 7/1999 |

* cited by examiner

*Primary Examiner*—Daniel L Robinson
(74) *Attorney, Agent, or Firm*—Oblon, Spivak, McClelland, Maier & Neustadt, P.C.

(57) ABSTRACT

A processing chamber is partitioned into a processing space and an evacuation space by a partitioning plate having formed therein a plurality of communicating holes. A processing gas supply means for supplying a processing gas into the processing space, a pressure adjusting gas supply means for supplying a pressure adjusting gas to be used to adjust the pressure inside the processing chamber into the evacuation space and a pressure controller are disposed at the processing chamber. When the processing gas is supplied from the processing gas supply means, the pressure controller executes pressure control so as to set the pressure in the processing space to a predetermined level by supplying the pressure adjusting gas from the pressure adjusting gas supply means. As a result, the pressure inside the processing chamber can be controlled without having to control the displacement quantity of the processing chamber or adversely affecting the substrate processing.

6 Claims, 3 Drawing Sheets

SUBSTRATE PROCESSING APPARATUS, PRESSURE CONTROL METHOD FOR SUBSTRATE PROCESSING APPARATUS AND RECORDING MEDIUM HAVING PROGRAM RECORDED THEREIN

CROSS REFERENCE TO RELATED APPLICATIONS

This document claims priority to Japanese Patent Application Number 2004-306522, filed on Oct. 21, 2004 and U.S. Provisional Application No. 60/635,489, filed on Dec. 14, 2004, the entire content of which are hereby incorporated by reference.

FIELD OF THE INVENTION

The present invention relates to a substrate processing apparatus that processes a substrate with a processing gas, a pressure control method for a substrate processing apparatus and a recording medium having a program recorded therein.

BACKGROUND OF THE INVENTION

There are substrate processing apparatuses known in the related art used to execute specific types of processing such as etching and film formation on a substrate to be processed (to be referred to simply as substrate subsequently), which may be a semiconductor wafer, a liquid crystal substrate or the like, placed on a stage disposed in a processing chamber by supplying a processing gas into the processing chamber. Such a substrate processing apparatus normally includes a gas supply system for supplying the processing gas into the processing chamber and an evacuation system for evacuating the processing chamber, and processes the substrate while concurrently supplying the processing gas through the gas supply system and executing control so as to set the pressure inside the processing chamber to a predetermined level.

The pressure inside the processing chamber is controlled while supplying the processing gas by controlling the displacement quantity achieved with the evacuation system in the related art. For instance, Japanese Laid Open Patent Publication No. H11-193464 (Reference Literature 1) discloses that the pressure inside the processing chamber is controlled at a specific level by controlling the displacement quantity with an APC unit (APC: automatic pressure controller) disposed at a piping for the evacuation system to control the degree of openness of the evacuation valve in correspondence to the pressure inside the processing chamber measured with a manometer.

However, there is a problem with the method described above in which the processing chamber internal pressure is controlled by controlling the displacement quantity of the processing chamber as described above in that if matter becomes adhered inside the evacuation pipe as the processing gas is discharged, the displacement quantity may change, the evacuation valve itself may become non-operational or accurate control of the processing chamber internal pressure may be disabled.

In addition, when the displacement quantity of the processing chamber is controlled through, for instance, APC control, the pressure control achieved through the APC control is limited to a narrow pressure control range determined by the size of the evacuation valve and the like. This leads to a problem in that each substrate processing apparatus needs to be mounted with an APC in compliance with the specifications of the particular apparatus including the processing chamber internal pressure setting selected for the substrate processing apparatus. Since the shape, the size and the like of the evacuation valve are determined in correspondence to the particular APC to be used, the evacuation system must be designed in accordance with the shape, the size and the like of the evacuation valve.

These problems are addressed in, for instance, Japanese Laid Open Patent Publication No. H08-134649 (Reference Literature 2), which discloses that the pressure inside the processing chamber is controlled in conformance to an ideal proportional curve until the pressure becomes equal to a specific pressure setting by supplying a pressure adjusting gas into the processing chamber without executing APC control.

However, Reference Literature 2 does not include any description of a specific area in the processing chamber to which the pressure adjusting gas may be supplied or any description of the processing chamber being partitioned into a space into which the processing gas is supplied and a space into which the pressure adjusting gas is supplied. Thus, as the pressure adjusting gas is supplied while the substrate processing is in progress in this apparatus, the processing gas and the pressure adjusting gas will become mixed together, altering the characteristics of the processing gas, which leads to a concern that the substrate processing may be adversely affected.

SUMMARY OF THE INVENTION

An object of the present invention, which has been completed by addressing the problems discussed above, is to provide a substrate processing apparatus and the like that make it possible to control the pressure inside the processing chamber without having to control the displacement quantity of the processing chamber or adversely affecting the substrate processing.

In order to achieve the object described above, in an aspect of the present invention, a substrate processing apparatus, comprising a processing chamber in which a substrate is processed by using a processing gas, a partitioning plate that is disposed inside the processing chamber so as to partition the processing chamber into a processing space in which the substrate is processed and an evacuation space through which the processing chamber is evacuated, and includes a plurality of communicating holes for communicating between the processing space and the evacuation space, a processing gas supply means for supplying the processing gas into the processing space within the processing chamber, a pressure adjusting gas supply means for supplying a pressure adjusting gas to be used to adjust the pressure inside the processing chamber into the evacuation space within the processing chamber, and a pressure control means for executing pressure control so as to set the pressure in the processing space to a predetermined level by supplying the pressure adjusting gas via the pressure adjusting gas supply means while supplying the processing gas via the processing gas supply means, is provided.

In another aspect of the present invention, the object described above is achieved in a pressure control method for a substrate processing apparatus that includes a processing chamber partitioned into a processing space and an evacuation space by a partitioning plate with a plurality of communicating holes formed therein, processes a substrate by supplying a processing gas into the processing space and evacuates the processing chamber via the evacuation space, characterized in that pressure control is executed to set the pressure in the processing space to a predetermined level by supplying a pressure adjusting gas into the evacuation space while monitoring the pressure in the processing space in the processing chamber being supplied with the processing gas.

In the apparatus or the method according to the present invention described above, it is possible to control the processing chamber internal pressure by controlling the supply of the pressure adjusting gas instead of the displacement quantity of the processing chamber. The range of the processing chamber internal pressure control achieved through the control of the pressure adjusting gas supply is greater than the range of internal pressure control achieved by controlling the displacement quantity of the processing chamber with a pressure control device (such as an APC). In addition, since an expensive pressure control device is not required and a simple switching valve can be used as the evacuation valve to be mounted in the evacuation system, the degree of freedom in the apparatus design including the shape, the size and the like of the evacuation valve increases while lowering the manufacturing costs.

In addition, according to the present invention, the processing chamber is partitioned by the partitioning plate into the processing space into which the processing gas is supplied and the evacuation space into which the pressure adjusting gas is supplied, and thus, the processing gas and the pressure adjusting gas never become mixed together. Consequently, the pressure inside the processing chamber can be controlled without adversely affecting the substrate processing.

It is desirable that a processing space pressure detecting means for detecting the pressure in the processing space and an evacuation space pressure detecting means for detecting the pressure in the evacuation space be included in the apparatus or in conjunction with the method described above and that the pressure control means monitor the processing space pressure with the processing space pressure detecting means and the evacuation space pressure with the evacuation space pressure detecting means while supplying the processing gas via the processing gas supply means and execute pressure control so as to set the processing space pressure to the predetermined level by controlling the flow rate of the pressure adjusting gas supplied via the pressure adjusting gas supply means to ensure that the evacuation space pressure never exceeds the processing space pressure. In this case, control may be executed to reduce the quantity of pressure adjusting gas supplied by the pressure adjusting gas supply means or stop the supply of the pressure adjusting gas altogether until the pressure difference represented by a value obtained by, for instance, subtracting the evacuation space pressure from the processing space pressure, which has become equal to or smaller than a predetermined value, becomes greater than the predetermined value.

Through the control described above, the evacuation space pressure can be controlled so that it never exceeds the processing space pressure even when the increase rate of the pressure in the evacuation space within the processing chamber is unexpectedly high relative to the increase rate of the processing space pressure. Thus, the occurrence of any back flow of gas from the evacuation space to the processing space can be prevented reliably.

The pressure adjusting gas used in the apparatus or the method described above may be, for instance, an inert gas. It is desirable to select a type of gas that will at least not affect the processing of the substrate executed with the processing gas. It may be a type of gas, e.g., an inert gas, which is different from the processing gas, or the pressure adjusting gas may be the same type of gas as the processing gas. From the viewpoint of cost performance, however, it is more desirable to use an inert gas which is bound to be less expensive. If a corrosive gas is used as the processing gas, a type of gas that dilutes the processing gas may be used as the pressure adjusting gas. In such a case, while the wafer is being processed with the corrosive gas, the corrosive gas can be diluted and discharged, which eliminates the need to include a means for diluting the corrosive gas at the evacuation system. In addition, since the corrosive gas is first diluted and then flows to the evacuation system, byproducts of the corrosive gas are not allowed to readily adhere to the piping in the evacuation system and, as a result, the maintenance cycle can be extended.

The partitioning plate in the apparatus or the method may be an evacuation ring disposed so as to surround the stage on which the substrate is placed. With the partitioning plate constituted with an evacuation ring such as an evacuation plate, which is disposed in the processing chamber to partition it into the processing space and the evacuation space, the flow of the gas being discharged can be rectified as well.

The object described above is achieved in yet another aspect of the present invention providing a computer-readable recording medium having recorded therein a program to be used to execute pressure control for a substrate processing apparatus that includes a processing chamber partitioned into a processing space and an evacuation space by a partitioning plate with a plurality of communicating holes formed therein, processes a substrate by supplying a processing gas into the processing space and evacuates the processing chamber via the evacuation space, characterized in that pressure control is executed by supplying a pressure adjusting gas into the evacuation space while supplying the processing gas into the processing space in the processing chamber so as to set the pressure inside the processing space to a predetermined level.

Throughout the description presented in the specification, it is assumed that 1 Torr=(101325/760) Pa and 1 mTorr=($10^{-3}$×101325/760) Pa.

DETAILED DESCRIPTION OF PREFERRED EMBODIMENT

The following is a detailed explanation of the preferred embodiment of the present invention, given in reference to the attached drawings. It is to be noted that in the specification and the drawings, the same reference numerals are assigned to components having substantially identical functions and structural features to preclude the necessity for a repeated explanation thereof.

(Structure of Substrate Processing Apparatus)

Figure 1:
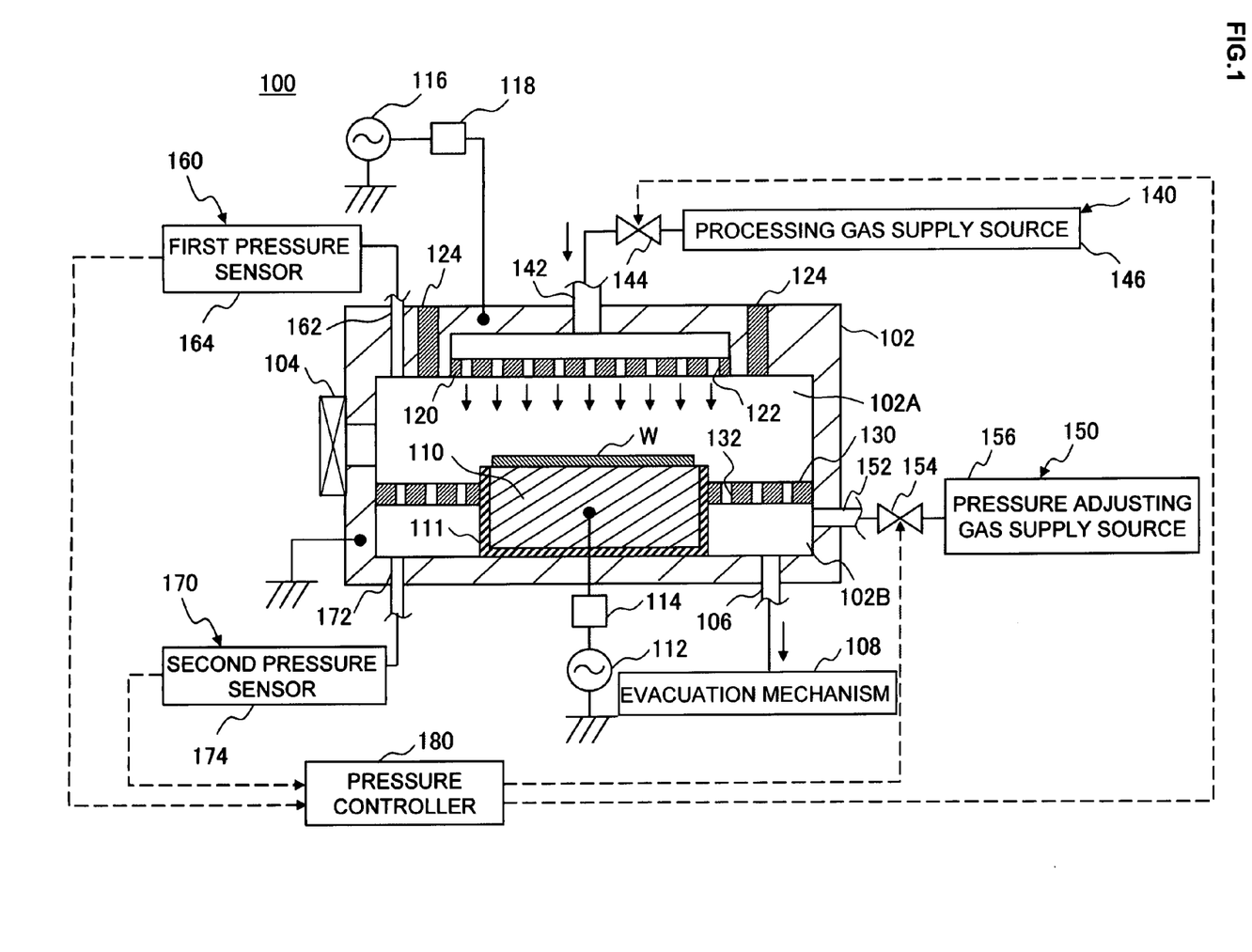
FIG. 1 schematically shows the structure adopted in the substrate processing apparatus achieved in an embodiment of the present invention.

First, the structure of the substrate processing apparatus achieved in the embodiment of the present invention is explained in detail in reference to a drawing. FIG. 1 schematically shows the structure of the substrate processing apparatus achieved in the embodiment. The substrate processing apparatus 100 includes a processing chamber 102 in which a substrate such as a semiconductor wafer (hereafter may be simply referred to as a "wafer") W is processed with a processing gas. The processing chamber 102 may be constituted with, for instance, an electrically conductive air-tight processing container and is grounded for safety. A gate valve 104 which is opened/closed to allow a wafer to be transferred from the processing chamber 102 to a load lock chamber or a transfer chamber (not shown) and vice versa is disposed at a side surface of the processing chamber 102.

Inside the processing chamber 102, a lower electrode 110 that also functions as a stage for the wafer and an upper electrode 120 that also functions as a showerhead through which a processing gas is supplied into the processing chamber 102 are disposed facing opposite each other. To the lower electrode 110, which is connected with a high frequency power source 112 via a matcher 114, biasing high frequency power at, for instance, 13.56 MHz, is applied. The lower electrode 110 is disposed inside the processing chamber 102 via an insulating member 111 and is thus electrically insulated from the processing container constituting the processing chamber 102. To the upper electrode 120, which is connected with a high frequency power source 116 via a matcher 118, high frequency power for plasma generation at, for instance, 60 MHz is applied. An insulator 124 is disposed between the upper electrode 120 and the processing chamber 102 to electrically insulate them from each other.

At the lower electrode (susceptor) 110, an evacuation plate 130 such as an evacuation ring (diffusion plate) to function as a partitioning plate is disposed so as to surround the lower electrode 110. The evacuation plate 130 is disposed so as to partition the space inside the processing chamber 102 into a first space (a first area portion) and a second space (a second area portion). The first space may be a processing space (a processing area portion) 102A where the wafer is processed, and the second space may be an evacuation space (an evacuation area portion) 102B through which the processing chamber 102 is evacuated in this instance. The evacuation plate 130 includes a plurality of communicating holes 132 formed therein to communicate between the first space and the second space, i.e., between the processing space 102A and the evacuation space 102B.

A processing gas supply means 140 for supplying the processing gas into the processing space 102A inside the processing chamber 102 is disposed at the upper electrode 120. The processing gas supply means 140 may be constituted by, for instance, connecting via a control valve 144 a processing gas supply source 146 to a gas supply pipe 142 disposed at the upper electrode 120. It is to be noted that the control valve 144 may be constituted with a switching valve or a flow-regulating means (e.g., a mass flow controller or a flow-regulating valve). Alternatively, the control valve may be constituted with both a switching valve and a flow-regulating means.

Numerous gas delivery holes 122 are formed at the upper electrode 120. Through the gas delivery holes 122, the processing gas supplied from the processing gas supply source 146 via the gas supply pipe 142 can be injected evenly into the processing space 102A inside the processing chamber 102.

A pressure adjusting gas supply means 150 for supplying a pressure adjusting gas to the evacuation space 102B in the processing chamber 102 is disposed in the processing chamber 102. The pressure adjusting gas supply means 150 may be constituted by, for instance, connecting via a control valve 154 and a pressure adjusting gas supply source 156 to a gas supply pipe 152 disposed at the side surface of the processing chamber 102 located near the evacuation space 102B. It is to be noted that the control valve 154 may be constituted with a switching valve or a flow-regulating means (e.g., a mass flow controller or a flow-regulating valve). Alternatively, the control valve may be constituted with both a switching valve and a flow-regulating means.

An evacuation pipe 106 is disposed on the side where the evacuation space 102B is located in the processing chamber 102. An evacuation mechanism 108 that evacuate the processing chamber 102 is connected to the evacuation pipe 106. The evacuation mechanism 108 may be constituted by connecting an evacuation valve and a vacuum pump such as a dry pump or a turbo pump to the evacuation pipe 106. It is to be noted that as long as the processing chamber 102 can be forcibly evacuated through the evacuation pipe 106, it is not strictly necessary that a vacuum pump be included in the evacuation mechanism 108. For instance, instead of including a vacuum pump in the evacuation mechanism 108, the processing chamber may be evacuated by using an evacuation facility of the plant where the substrate processing apparatus 100 is installed, in conjunction with an evacuation mechanism 108 constituted with an evacuation valve alone.

A first pressure detecting means (a processing space pressure detecting means) 160 for detecting the pressure in the processing space 102A is disposed at the processing chamber 102. The first pressure detecting means 160 may be constituted with, for instance, a first pressure sensor 164 connected by a pressure detection hole 162 formed at the processing chamber 102 on the side where the processing space 102A is located. It is to be noted that the first pressure sensor 164 may be connected to the pressure detection hole 162 via a switching valve.

In addition, a second pressure detecting means (evacuation space pressure detecting means) 170 for detecting the pressure in the evacuation space 102B is disposed at the processing chamber 102. The second pressure detecting means 170 may be constituted with, for instance, a second pressure sensor 174 connected via a pressure detection hole 172 formed at the processing chamber 102 on the side where the evacuation space 102B is located. It is to be noted that the second pressure sensor 174 may be connected to the pressure detection hole 172 via a switching valve.

It is desirable that the first and second pressure sensors 164 and 174 each be constituted with a pressure sensor with a wide pressure detection range to enable pressure control over a wide pressure range inside the processing chamber 102. More specifically, the first and second pressure sensors 164 and 174 should each be constituted with a diaphragm gauge such as a capacitance manometer. A diaphragm gauge, which measures a pressure based upon a change in the electrostatic capacity by using a thin metal film, is normally capable of pressure measurement in a range of $10^{-4}$ Torr through $10^2$ Torr and outputs a voltage corresponding to the detected pressure as a pressure detection value.

The substrate processing apparatus 100 also includes a pressure controller 180 constituting a pressure control means for executing pressure control inside the processing chamber 102. Although not shown, the pressure controller 180 includes various instruments used in the pressure control, including an A/D (analog-digital) converter that executes analog-digital conversion for the outputs from the first and second pressure sensors 164 and 174, a controller that provides control signals to the control valves 144 and 154 at the individual gas supply means 140 and 150 and a memory in which the pressure setting for the processing chamber 102 and the like for substrate processing are stored.

Based upon the outputs from the first and second pressure sensors 164 and 174 and the pressure setting mentioned above, the pressure controller 180 individually provides the control valves 144 and 154 with control signals. The control valves 144 and 154 are controlled based upon these control signals and the flow rate of the processing gas and the flow rate of the pressure adjusting gas are individually controlled.

Figure 3:
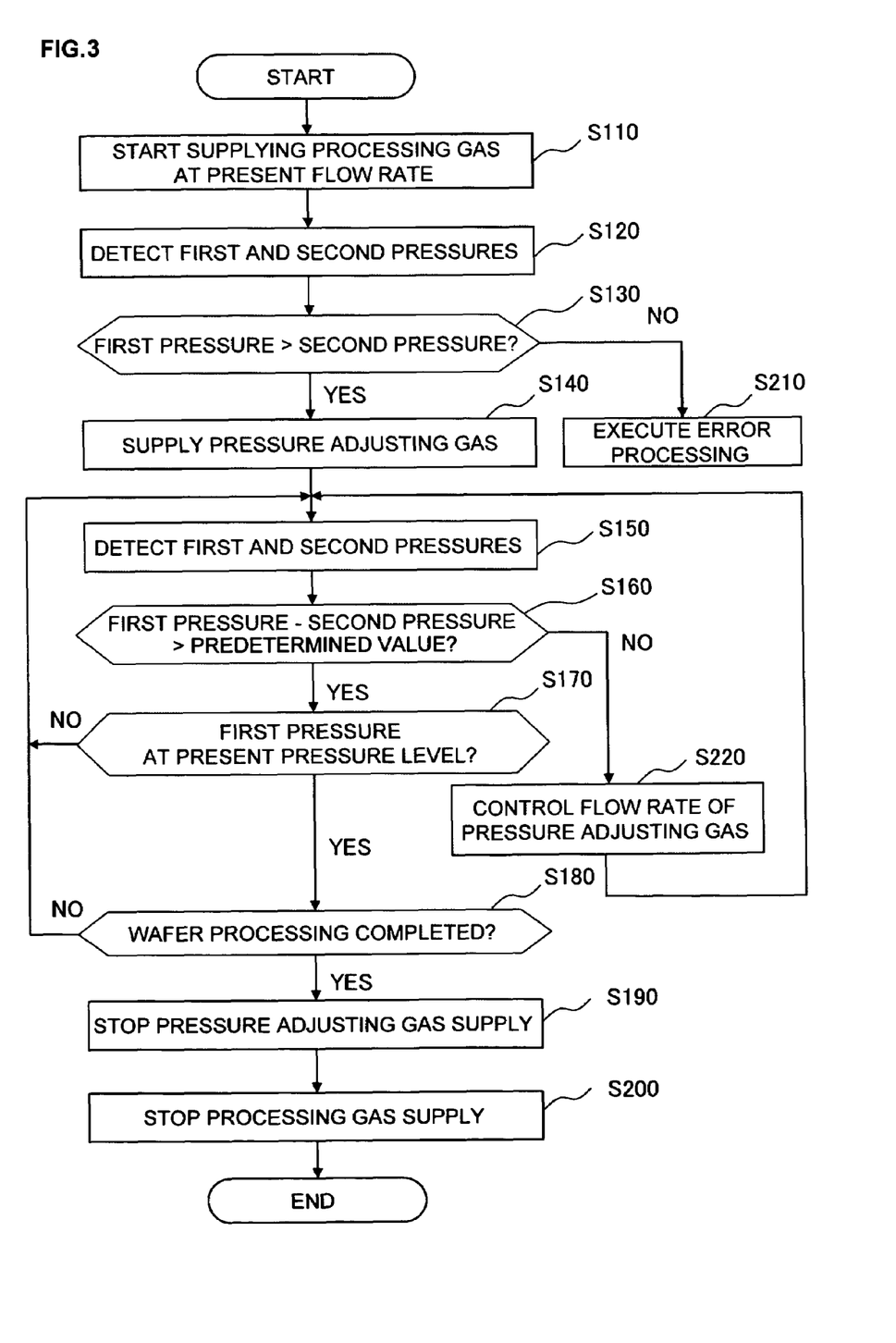
FIG. 3 presents a flowchart of an example of pressure control that may be executed by the pressure controller in FIG. 1 during substrate processing.

It is to be noted that the pressure controller 180 may include a CPU (central processing unit) and a memory such as a ROM (read-only memory) or a RAM (random access memory) having stored therein a program and the like, and execute the pressure control as shown in FIG. 3, which is to be referred to later, based upon a program stored in a computer-readable recording medium such as a ROM or a hard disk. Alternatively, the pressure controller 180 may be constituted with hardware that includes a circuit for executing the pressure control as shown in FIG. 3. Furthermore, the pressure controller 180 does not need to be constituted as an independent unit and instead, it may be achieved as an integrated part of the main control unit which executes overall control of the substrate processing apparatus 100 and the pressure control shown in FIG. 3 may be executed as part of a program used by, for instance, a CPU (central processing unit) in the main control unit to implement overall control for the substrate processing apparatus 100.

(Types of Gases Used as Processing Gas and Pressure Adjusting Gas)

Next, an explanation is given on specific examples of types of gases to be used as the processing gas and the pressure adjusting gas. A gas satisfying the requirements for the substrate processing is used as the processing gas. For instance, a fluorocarbon gas, a corrosive gas or the like should be used for an etching process. Such a corrosive gas may be, for instance, HBr, $NF_3$, HCl, $Cl_2$, or HI (hydrogen iodide). It is to be noted that the processing gas may be constituted with a single type of gas, or it may be a mixed gas containing several different types of gases.

A gas that, at least, will not affect the substrate processing executed by using the processing gas is used as the pressure adjusting gas. Such a pressure adjusting gas may be, for instance, a diluent such as $N_2$ gas or an inert gas such as Ar. While one of the gases listed above that are different from the processing gas may be used for the pressure adjusting gas, the same type of gas as that constituting the processing gas may be used as the pressure adjusting gas, instead. From the viewpoint of cost performance, however, it is more desirable to use an inert gas which is bound to be less expensive. If a corrosive gas is used as the processing gas, a type of gas (e.g., $N_2$ gas) that dilutes the processing gas may be used as the pressure adjusting gas. In such a case, while the wafer is being processed with the corrosive gas, the corrosive gas can be diluted and discharged, which eliminates the need to include a means for diluting the corrosive gas at the evacuation system. In addition, since the corrosive gas is first diluted and then flows to the evacuation system, constituted with the evacuation mechanism 108 and the like, byproducts of the corrosive gas are not allowed to readily adhere to the piping in the evacuation system and, as a result, the maintenance cycle can be extended.

(Flow Rate of Pressure Adjusting Gas)

Now, an explanation is given on the flow rate of the pressure adjusting gas. The flow rate of the pressure adjusting gas is determined in correspondence to the flow rate of the processing gas and the evacuation capability of the evacuation mechanism 108 including the evacuation capability of the vacuum pump. In more specific terms, the evacuation capability of, for instance, the evacuation mechanism 108 sets limits to the overall flow rate representing the sum of the flow rate of the processing gas and the flow rate of the pressure adjusting gas. In other words, if the processing gas and the pressure adjusting gas are supplied in excessively large quantities and the displacement quantity that needs to be achieved to execute effective pressure control inside the processing chamber 102 exceeds the limit of the evacuation capability of the evacuation mechanism 108, the pressure inside the processing chamber 102 rises to an excessively high level and the control for sustaining the internal pressure in the processing chamber 102 at the predetermined pressure setting can no longer be executed. Accordingly, it is necessary to set the flow rate of the pressure adjusting gas in correspondence to the flow rate of the processing gas to ensure that their sum does not exceed the limit.

Figure 2:
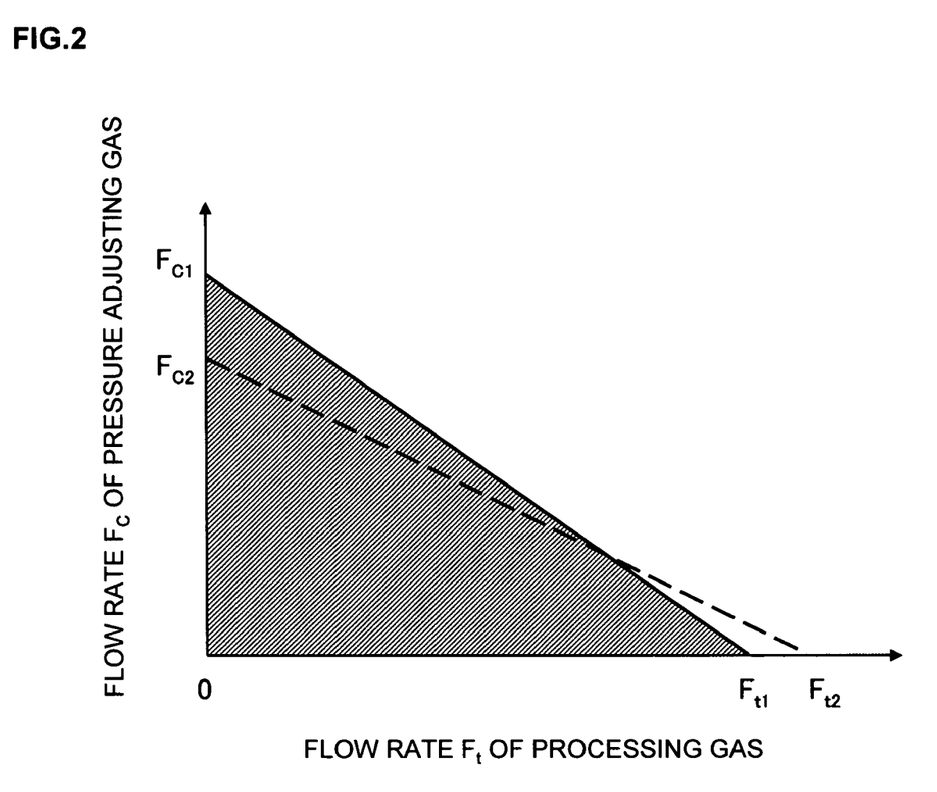
FIG. 2 is a conceptual diagram, indicating the limit value for the flow rate of the pressure adjusting gas in relation to the flow rate of the processing gas.

The limit thus set for the flow rate of the pressure adjusting gas is now explained in reference to a drawing. FIG. 2 is a conceptual diagram of the limit to the flow rate of the pressure adjusting gas in relation to the flow rate of the processing gas. The flow rate $F_t$ of the processing gas and the flow rate $F_c$ of the pressure adjusting gas are respectively indicated along the horizontal axis and the vertical axis in FIG. 2. The solid line graph and the dotted line graph in FIG. 2 each indicate the limit for the flow rate $F_c$ of the pressure adjusting gas, determined in correspondence to the evacuation capability of the evacuation mechanism 108 and the like as explained earlier.

As shown in FIG. 2, the limit for the flow rate $F_c$ of the pressure adjusting gas is higher when the flow rate $F_t$ of the processing gas is relatively low and is lower when the flow rate $F_t$ of the processing gas is relatively high, since the displacement quantity to be achieved in correspondence to the flow rates of the processing gas and the pressure adjusting gas must never exceed the limit to the evacuation capability of the evacuation mechanism 108. Accordingly, the flow rate $F_c$ of the pressure adjusting gas needs to be set to a value at least lower than the limit. For instance, when the limit for the flow rate $F_c$ of the pressure adjusting gas is indicated with the solid line ($F_{c1}$, $F_{t1}$), the flow rate $F_c$ of the pressure adjusting gas should be determined in correspondence to the flow rate $F_t$ of the processing gas within the range indicated by the solid line in the graph ($F_{c1}$, $F_{t1}$) (the shaded range in FIG. 2).

It is to be noted that another factor, i.e., the molecular weight of the specific type of gas being supplied into the processing chamber 102, determines the pressure within the processing chamber 102. For instance, a gas with a greater molecular weight supplied into the processing chamber at a given flow rate causes the pressure in the processing chamber 102 to increase more rapidly than a gas with a lesser molecular weight supplied into the processing chamber 102 at the same flow rate. For this reason, the limit for the flow rate $F_c$ of the pressure adjusting gas changes in correspondence to the molecular weight of the processing gas. For instance, the limit $F_c$ for the flow rate of the pressure adjusting gas used in conjunction with a processing gas having a greater molecular weight is indicated by the dotted line graph in FIG. 2, which is clearly distinguishable from the solid line graph indicating the limit for the flow rate $F_c$ of the pressure adjusting gas used in conjunction with a processing gas having a lesser molecular weight. Namely, the dotted line graph has a smaller slope than the solid line graph in FIG. 2, since the pressure in the processing chamber 102 supplied with the processing gas with greater molecular weight increases faster and the limit for the flow rate $F_c$ of the pressure adjusting gas is lowered as a result.

(Operation of Substrate Processing Apparatus)

In the substrate processing apparatus 100 structured as described above, the processing gas originating from the processing gas supply source 146 is supplied by the processing gas supply means 140 to the upper electrode 120 via the gas supply pipe 142 and is then supplied into the processing space 102A via the gas delivery holes 122. Concurrently, the pressure adjusting gas from the pressure adjusting gas supply source 150 is supplied by the pressure adjusting gas supply means 150 into the evacuation space 102B. Then, with the flow rate of the pressure adjusting gas controlled by the pressure controller 180, the pressure inside the processing chamber 102 is controlled so as to achieve the preset pressure level. It is to be noted that the pressure control inside the processing chamber 102 executed by the pressure controller 180 is to be described in detail later.

In addition, biasing high frequency power at, for instance, 13.56 MHz is applied to the lower electrode 110, and high frequency power for plasma generation at, for instance, 60 MHz is applied to the upper electrode 120. As a result, the processing gas having been supplied into the processing space 102A in the processing chamber 102 is raised to plasma with which a specific type of processing such as etching or film formation is executed on the wafer. Then, the processing gas inside the processing chamber 102 flows into the evacuation space 102B together with the pressure adjusting gas via the evacuation plate 130 and is discharged by the evacuation mechanism 108 from the evacuation space 102B via the evacuation pipe 106.

(Pressure Control Inside Processing Chamber)

Next, the pressure control executed for the substrate processing apparatus structured as described above is explained in reference to a drawing. The explanation specifically focuses on the pressure control inside the processing chamber 102 executed by the pressure controller 180 in the substrate processing apparatus 100. FIG. 3 presents a flowchart of pressure control that may be executed by the pressure controller during substrate processing.

In step S110 in FIG. 3, the pressure controller 180 starts supplying the processing gas at a preset flow rate. More specifically, the pressure controller controls the control valve 144 in the processing gas supply means 140 and starts supplying the processing gas from the processing gas supply source 146 into the processing space 102A in the processing chamber 102. Concurrently, the evacuation mechanism 108 evacuates the processing chamber via the evacuation space 102B. Thus, the processing gas is continuously supplied at the preset flow rate into the processing space 102A while the evacuation space 102B is evacuated.

Next, a first pressure, i.e., the pressure in the processing space 102A (hereafter may be simply referred to as a "processing space pressure"), and a second pressure, i.e., the pressure in the evacuation space 102B (hereafter may be simply referred to as "evacuation space pressure") are detected in step S120. More specifically, the processing space pressure (the first pressure) is detected with the first pressure sensor 164 of the first pressure detecting means (processing space pressure detecting means) 160 and the evacuation space pressure (the second pressure) is detected with the second pressure sensor 174 of the second pressure detecting means (evacuation space pressure detecting means) 170. Then, in step S130, a decision is made as to whether or not the processing space pressure (the first pressure) is higher than the evacuation space pressure (the second pressure).

If it is decided in step S130 that the processing space pressure (the first pressure) is higher than the evacuation space pressure (the second pressure), the processing chamber is judged to be in the normal state and, accordingly, the processing chamber internal pressure is controlled through the pressure adjusting gas supply in step S140 and subsequent steps.

If, on the other hand, it is decided in step S130 that the processing space pressure (the first pressure) is equal to or lower than the evacuation space pressure (the second pressure), the processing chamber is judged to be in an abnormal state and, accordingly, error processing is executed in step S210. In this situation, the processing chamber is judged to be in an abnormal state since no pressure adjusting gas has been supplied yet and thus, the state is not attributable to the pressure adjusting gas. More specifically, the state may indicate a failure in a pressure sensor. Alternatively, it may be attributable to a failure in the evacuation mechanism or the like, inducing a back flow from the evacuation space 102B to the processing space 102A via the evacuation plate 130. The error processing is executed when such an abnormal state has manifested. In the error processing, a buzzer or the like may go off to alert the operator and the processing gas supply may be stopped. In addition, as part of the error processing, fault information indicating the occurrence of the abnormal state (e.g., FDC (fault detection and classification) information) may be stored into a fault information database or the like. If the substrate processing apparatus 100 has an online connection with a group server or a production management system (e.g., a computer integrated manufacturing system (CIM) that manages the plant), the fault information may also be provided to the group server or the production management system. The fault information having been provided to the group server or the production management system will then be stored for management into a database or the like at the group server or the production management system.

In step S140 and subsequent steps, the processing chamber internal pressure is controlled through the pressure adjusting gas supply. First, the pressure adjusting gas is supplied in step S140. More specifically, the pressure adjusting gas originating from the pressure adjusting gas supply source 156 is supplied into the evacuation space 102B in the processing chamber 102 by controlling the control valve 154 of the pressure adjusting gas supply means 150.

Next, the processing space pressure (the first pressure) and the evacuation space pressure (the second pressure) are detected respectively with the first pressure sensor 164 and the second pressure sensor 174 in step S150. Then, in step S160, a decision is made as to whether or not the difference between the pressures in the two spaces, e.g., the difference calculated by subtracting the evacuation space pressure (the second pressure) from the processing space pressure (the first pressure), is greater than a predetermined value.

If it is decided in step S160 that the pressure difference calculated by subtracting the evacuation space pressure (the second pressure) from the processing space pressure (the first pressure) is equal to or less than the predetermined value, the flow rate of the pressure adjusting gas is controlled in step S220 and the operation returns to the processing in step S150. More specifically, the flow rate of the pressure adjusting gas is reduced or the pressure adjusting gas supply is stopped by controlling the control valve 154 of the pressure adjusting gas supply means 150. This control under which the flow of the pressure adjusting gas is reduced or stopped is carried on until the pressure difference between the processing space pressure (the first pressure) and the evacuation space pressure (the second pressure) becomes greater than the predetermined value.

Through the processing executed in steps S150, S160 and S220 as described above, the evacuation space pressure (the second pressure) is controlled at all times so that it never exceeds the processing space pressure (the first pressure). As a result, the risk of a back flow from the evacuation space 102B to the processing space 102A, which would be induced if the processing space pressure (the first pressure) became lower than the evacuation space pressure (the second pressure), is preempted.

It is to be noted that the predetermined value used in the decision-making in step S160 should assume an optimal value selected based upon, for instance, the flow rate of the pressure adjusting gas relative to the flow rate of the processing gas. For instance, it is desirable to select a rather large value for the predetermined value when the flow rate of the pressure adjusting gas relative to the flow rate of the processing gas is high, since the pressure in the evacuation space rises quickly under such circumstances.

In addition, if it is decided in step S160 that the pressure difference between the processing space pressure (the first pressure) and the evacuation space pressure (the second pressure) is greater than the predetermined value, a decision is made in step S170 as to whether or not the processing space pressure (the first pressure) has become equal to a specific preset pressure.

If it is decided in step S170 that the processing space pressure (the first pressure) has not reached the preset level, the operation returns to the processing in step S150, whereas if it is decided in step S170 that the processing space pressure (the first pressure) has reached the preset level, a decision is made in step S180 as to whether or not the wafer processing has been completed.

If it is decided in step S180 that the wafer processing such as etching or film formation has been completed, the supply of pressure adjusting gas is stopped by controlling the control valve 154 of the pressure adjusting gas supply means 150 in step S190. Then, the processing gas supply is stopped by controlling the control valve 144 of the processing gas supply means 140 in step S200, before the pressure control sequence ends.

As described above, the internal pressure in the processing chamber 102 can be controlled by controlling the pressure adjusting gas supply through the processing executed in, for instance, steps S140 through S190 in the embodiment. As a result, the internal pressure in the processing chamber 102 can be controlled without having to control the displacement quantity of the processing chamber. Consequently, the pressure within the processing chamber 102 can be controlled over a wider range compared to the range of control achieved by controlling the displacement quantity of the processing chamber 102 with a pressure control device (such as an APC) with a narrow pressure control range.

In addition, since the control can be implemented without having to use an expensive pressure control device (such as an APC), a simple switching valve such as a gate valve instead of a pressure control valve constituted with, for instance, an APC valve, can be installed as the evacuation valve at the piping of the evacuation mechanism 108. As a result, the degree of freedom in design including the shape and size of the evacuation valve is increased while lowering the manufacturing cost.

Furthermore, the processing chamber 102 is partitioned by a partitioning plate constituted with, for instance, the evacuation plate 130 into the processing space 102A and the evacuation space 102B, the processing gas is supplied to the processing space 102A and the pressure adjusting gas is supplied to the evacuation space 102B, so as to ensure that the pressure adjusting gas is not allowed to become mixed with the processing gas. In other words, since the side of the processing chamber, on which the evacuation space 102B is present, is evacuated with the evacuation mechanism 108, a gas flow from the processing space 102A to the evacuation space 102B via the evacuation plate 130 is created and thus, the pressure adjusting gas is not allowed to become mixed with the processing gas under normal circumstances. Consequently, the pressure inside the processing chamber can be controlled without adversely affecting the substrate processing.

Even when the rate at which the evacuation space pressure rises inside the processing chamber 102 for some reason becomes unexpectedly high relative to the processing space pressure increase rate, the flow rate of the pressure adjusting gas is controlled to ensure that the evacuation space pressure never exceeds the processing space pressure by constantly monitoring the processing space pressure (the first pressure) and the evacuation space pressure (the second pressure). As a result, any back flow of gas from the evacuation space 102B to the processing space 102A can be reliably prevented. More specifically, if the pressure difference between the processing space pressure (the first pressure) and the evacuation space pressure (the second pressure) becomes equal to or less than the predetermined value, control is executed to reduce or stop the flow of the pressure adjusting gas supplied by the pressure adjusting gas supply means 150 until the pressure difference becomes greater than the predetermined value as in, for instance, steps S150, S160 and S220. Since the flow of the pressure adjusting gas is either reduced or stopped before the evacuation space pressure (the second pressure) becomes higher than the processing space pressure (the first pressure) under this control, the risk of a back flow occurring from the evacuation space 102B to the processing space 102A is preempted.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

While an explanation is given above in reference to the embodiment on an example in which the pressure inside the processing chamber 102 is controlled when supplying processing gas into the processing chamber during substrate processing, the present invention is not limited to this example and it may be adopted in pressure control executed to control the pressure inside the processing chamber 102 when processing gas or another type of gas is supplied into the processing chamber 102 for purposes other than substrate processing.

What is claimed is:

1. A substrate processing apparatus, comprising:
a processing chamber in which a substrate is processed by using a processing gas;
a partitioning plate that is disposed inside said processing chamber so as to partition said processing chamber into a processing space in which the substrate is processed and an evacuation space through which said processing chamber is evacuated, having formed therein a plurality of communicating holes communicating between said processing space and said evacuation space;
a processing gas supply means for supplying the processing gas into said processing space within said processing chamber;
a pressure adjusting gas supply means for supplying a pressure adjusting gas to be used to adjust the pressure inside said processing chamber into said evacuation space within said processing chamber; and
a pressure control means for executing pressure control by supplying the pressure adjusting gas into said evacuation space via said pressure adjusting gas supply means while supplying the processing gas into said processing space via said processing gas supply means, so as to set the pressure in said processing space to a predetermined level.

2. A substrate processing apparatus according to claim 1, further comprising:
a processing space pressure detecting means for detecting the pressure in said processing space; and
an evacuation space pressure detecting means for detecting the pressure in said evacuation space, wherein:

said pressure control means monitors the processing space pressure with the processing space pressure detecting means and the evacuation space pressure with the evacuation space pressure detecting means while supplying the processing gas via said processing gas supply means and executes pressure control so as to set the processing space pressure to the predetermined level by controlling the flow rate of the pressure adjusting gas supplied by said pressure adjusting gas supply means to ensure that the evacuation space pressure never exceeds the processing space pressure.

3. A substrate processing apparatus according to claim 2, wherein:

said pressure control means stops or reduces the flow of pressure adjusting gas supplied by said pressure adjusting gas supply means until a pressure difference between the processing space pressure and the evacuation space pressure, which has become equal to or smaller than a predetermined value, becomes larger than said predetermined value.

4. A substrate processing apparatus according to claim 1, wherein:

said pressure adjusting gas is an inert gas.

5. A substrate processing apparatus according to claim 1, wherein:

said processing gas is a corrosive gas and said pressure adjusting gas is a type of gas that dilutes said processing gas.

6. A substrate processing apparatus according to claim 1, wherein:

said partitioning plate is constituted with an evacuation ring disposed so as to surround a stage on which said substrate is placed.

* * * * *